United States Patent
Monnerat

(10) Patent No.: US 7,155,653 B2
(45) Date of Patent: Dec. 26, 2006

(54) SYSTEM AND METHOD FOR TESTING ELECTRONIC DEVICE PERFORMANCE

(75) Inventor: Edward D. Monnerat, Parker, CO (US)

(73) Assignee: Comcast Cable Holdings, LLC, Philadelphia, PA (US)

( * ) Notice: Subject to any disclaimer, the term of this patent is extended or adjusted under 35 U.S.C. 154(b) by 264 days.

(21) Appl. No.: 10/909,879

(22) Filed: Aug. 2, 2004

(65) Prior Publication Data

US 2006/0026481 A1    Feb. 2, 2006

(51) Int. Cl.
    *G06F 11/00* (2006.01)
(52) U.S. Cl. ......................................... 714/742; 714/46
(58) Field of Classification Search ................ 702/120, 702/188; 714/38, 46, 742; 717/133; 701/33
    See application file for complete search history.

(56) References Cited

U.S. PATENT DOCUMENTS

| | | | | |
|---|---|---|---|---|
| 5,724,273 A | * | 3/1998 | Desgrousilliers et al. ... | 702/120 |
| 5,781,720 A | * | 7/1998 | Parker et al. ................. | 714/38 |
| 6,154,876 A | * | 11/2000 | Haley et al. ................. | 717/133 |
| 6,526,526 B1 | * | 2/2003 | Dong et al. ................... | 714/46 |
| 6,728,612 B1 | * | 4/2004 | Carver et al. ................. | 701/33 |
| 6,810,364 B1 | * | 10/2004 | Conan et al. ............... | 702/188 |

* cited by examiner

Primary Examiner—David Ton
(74) Attorney, Agent, or Firm—Brooks Kushman P.C.

(57) ABSTRACT

A system for testing electronic device performance includes a test device and at least one target device coupled to the test. The test device determines when at least one test command is incompatible with the at least one target device and modifies the at least one incompatible test command such that the at least one incompatible test command is compatible with the at least one target device. The test device presents the at least one compatible test command to the at least one target device and determines a response of the at least one target device to the respective at least one compatible test command.

20 Claims, 3 Drawing Sheets

SYSTEM AND METHOD FOR TESTING ELECTRONIC DEVICE PERFORMANCE

BACKGROUND OF THE INVENTION

1. Field of the Invention

This invention relates to a system and a method for testing electronic device performance.

2. Background Art

Electronic test equipment is often specific to the particular target device. As such, a technician (i.e., user) testing devices designed by different manufacturers must possess at least one test device (i.e., unit, module, box, etc.) for each manufacturer. In addition, the technician typically receives training to properly issue commands from the test equipment to the target (i.e., tested) device using the various manufacturer determined protocols. The plethora of additional equipment and training for technicians can cause employers of the users to incur great expense when testing services are expanded to include additional devices that are secured from theretofore unsupported manufacturers.

Similarly, as product lines evolve for the manufacturers, communication interface options also tend to evolve (e.g., a manufacturer may add serial ports to the equipment to be tested). As such, an additional test unit is typically purchased to take advantage of, for example, a newly added interface option and respective associated features.

One industry where such issues are becoming relevant is the set top box (STB) industry. A STB (i.e., decoder, receiver, tuner, transceiver) is a unit capable of receiving and decoding digital television (DTV) broadcasts (i.e., all formats of digital television, including high definition television (HDTV) and standard definition television (SDTV)). The STB typically converts and displays transmissions from one frequency or format (e.g., analog cable, digital cable, satellite broadcast, digital television, and the like) to a standard frequency (e.g., channel 3, channel 4, etc.) for display on a display device (e.g., television, monitor, and the like).

While STB manufacturers have incorporated some communication ports into STBs, conventional STB test devices are limited to communicating with STBs via infra-red (IR) wireless signals. Because the existing STB test devices are unable to communicate with STBs except via IR signals, the test devices are unable to take advantage of the additional features associated with the communication ports.

For example, the wireless infra-red communication is necessarily uni-directional (i.e., from the test device to the STB under test) due to the STBs inability to transmit infra-red signals. Because the existing test equipment is limited to infra-red communication, bi-directional communication remains unavailable even when a bi-directional port has been implemented into the STB. Because bi-directional communication is unavailable with conventional test equipment, complicated video capture and recognition techniques are used to determine when a test command has been received by the STB.

Similarly, the communication ports on STBs cannot be utilized to eliminate the problems associated with close proximity, and concurrent testing of STBs. Such problems arises due to the tendency of an infra-red wave to spread over distance.

Thus, it would be desirable to have a system and a method that would overcome the deficiencies of conventional test equipment.

SUMMARY OF THE INVENTION

Accordingly, the present invention generally provides a system and method for supporting multiple communication interfaces, multiple device specific communication protocols, and for translating generic user test commands into formats compatible with the supported device specific communication protocols.

The system and method of the present invention generally provides support for multiple communication interfaces (e.g., serial, USB, parallel, Firewire, Ethernet, etc.), multiple device specific communication protocols (e.g., AIP and the like), and translates generic user test commands (i.e., a single set of user commands recognized by the test device) into formats compatible with the supported device specific communication protocols. Such a system and method would allow a user to communicate with devices of various manufacturers via a single command language (i.e. generic user test commands). Furthermore, by supporting multiple communication interfaces, the system and method may allow a user to realize the benefits of additional port types as additional ports are implemented into the device by the device manufacturers.

According to the present invention, a system for testing device performance is provided. The system comprises a test device and at least one target device coupled to the test device. The test device determines when at least one test command is incompatible with the at least one target device and modifies the at least one incompatible test command such that the at least one incompatible test command is compatible with the at least one target device. The test device presents the at least one compatible test command to the at least one target device and determines a response of the at least one target device to the respective at least one compatible test command.

Also according to the present invention, a method for testing device performance is provided. The method comprises coupling a test device to at least one target device, determining when at least one test command is incompatible with the at least one target device, modifying the at least one test command when the at least one test command is incompatible with the at least one target device such that the at least one incompatible test command is compatible with the at least one target device, presenting the at least one compatible test command to the at least one target device, and determining a response of the at least one target device to the respective at least one compatible test command.

Still further according to the present invention, a system for testing device performance is provided. The system comprises a test device having a computer, and at least one target device coupled to the test device. The test device presents a script having at least one test command to the at least one target device, and determines the response of each target device to each test command. The test command is predetermined by a manufacturer of the target device.

These and other features and advantages of the present invention will be readily apparent upon consideration of the following detailed description of the invention in conjunction with the accompanying drawings.

DETAILED DESCRIPTION OF THE PREFERRED EMBODIMENT(S)

Figure 1A:
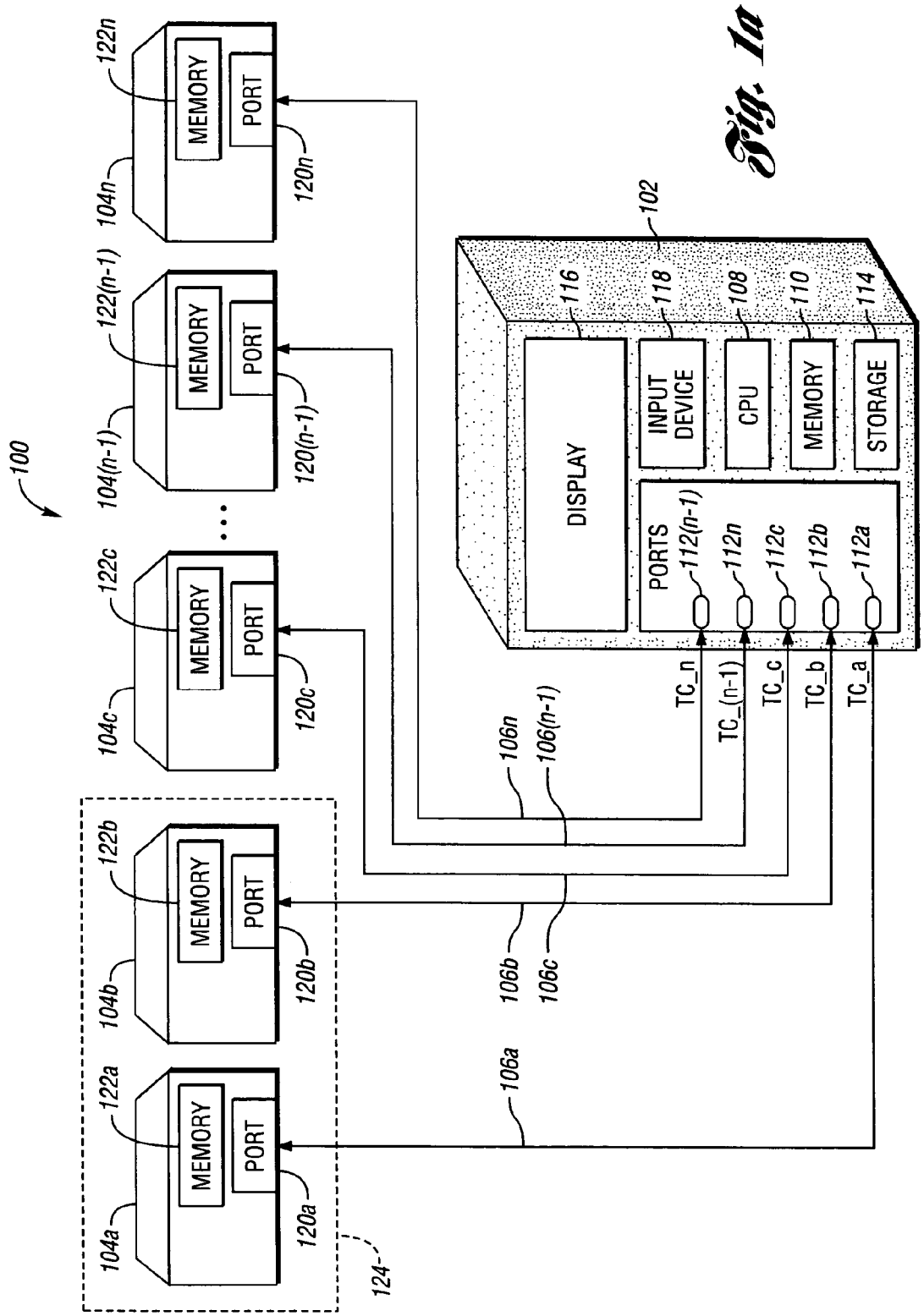
FIGS. 1(a–b) are diagrams of systems for testing device performance of the present invention.

Referring to FIG. 1a, a diagram illustrating a system 100 for testing device performance of the present invention is shown. The test system 100 generally comprises a test device 102, at least one target device 104 (e.g., set top boxes (STBs), digital media stream receivers, microprocessor controlled audio/video systems, and the like) (e.g., target devices 104a–104n), and respective interface device 106 (e.g., interfaces 106a–106n).

The test device 102 generally comprises a processor 108 (e.g., microprocessor, etc.), a memory unit 110 (e.g., random access memory (RAM), read only memory (ROM), EPROM, EEPROM, flash, etc.), communication ports 112 (e.g., ports 112a–112n), a storage device 114 (e.g., hard drive, floppy disk, tape, etc.), a display 116, and a user input device 118.

The processor 108 may generate test command signals, TC (e.g., TC_a, TC_b . . . TC_n). In one example, the processor 108 may be implemented in connection with a personal computer. In another example, the processor 108 may be implemented in connection with a dedicated computer. In yet another example, the processor 108 may be implemented in connection with a dedicated system. However, the processor 108 may be implemented in connection with any appropriate signal generating device (e.g., a test device, test equipment, etc.) to meet the design criteria of a particular application.

The processor 108 may be coupled to the interface devices 106 via communication ports 112 (e.g., ports 112a–112n). The test device communication port 112 is generally configured to be coupled to and to communicate with a respective target device 104 (e.g., via interconnecting cable 106) (i.e., present and receive the signals TC). In one example, the communication port 112 is configured to conform to at least one serial communication protocol. In another example, the communication port 112 is configured to conform to at least one Universal Serial Bus (USB) communication protocol (e.g., USB 1.0, USB 1.1, USB 2.0, USB-OTG, etc.). In one more example, the communication port 112 is configured to conform to IEEE-1394 (i.e., Firewire) communication protocol. In yet another example, the communication port 112 is configured to conform to at least one parallel communication protocol. In still another example, the communication port 112 is configured to conform to at least one Ethernet protocol. However, the communication port 112 may be configured to conform to any appropriate communication protocol to meet the design criteria of a particular application. The signals TC are generally communicated using the appropriate communication protocol.

The display device 116 may present a user (e.g., test technician, engineer, etc.) with relevant information (e.g., timing metrics, tuning metric, error metrics, test status, target devices connected, and the like) as determined (e.g., measured, calculated, analyzed, etc.) by the test device 102. In one example, the display 116 is a computer monitor. However, the display 116 may be implemented as any appropriate display device to meet the design criteria of a particular application.

The user input device 118 generally provides a user interface with (i.e., a mechanism to convey or present commands to) the test device 102. In one example, the user input device 118 may be implemented as a keyboard. In another example, the user input device 118 may be implemented as a mouse, trackball, or joystick. In yet another example, the user input device 118 may be implemented as a touch screen. However, the user input device 118 may be implemented as any appropriate input device to meet the design criteria of a particular application.

The test commands TC (e.g., TC_a–TC_n) may be stored in the memory unit 110 as a command entity (i.e., a script). One or more target devices 104 may be identified in memory 110 as a group 124. Script and group information may also be recorded (i.e., written, held, stored, contained, kept, etc.) on the storage unit 114.

As such, the user may command the test device 102 to transmit (i.e. present, send, convey, broadcast, etc.) a script (i.e., a set of one or more test commands TC) to a plurality of target devices 104 by providing instructions (i.e., commands) for the test device 102 to transmit the script TC to the desired group 124. The members (i.e., each target device 104) of a group 124 generally operate independently of one another such that an event (e.g., error, completion, etc.) at one target devices 104 while executing a test command TC will not affect the operation of any other target device 104 in the group 124. Alternatively, the test device 102 may present the signal (or script) TC to at least one target device 104 via the respective interface device 106.

The target device 104 (e.g., Panasonic TUCT30 STB, Sony VTX-D800 STB, Nokia 221T STB, and the like), generally comprises a communication port 120 and a memory unit 122. The memory unit 122 (e.g., random access memory (RAM), read only memory (ROM), EPROM, EEPROM, flash, etc.) may store programming code (e.g., serial-enabled platform code, and the like) to facilitate communication between the target device 104 and the test device 102.

The target device 104 may be coupled (i.e., connected) to the interface device 106 via the target device communication port 120. The test device 102 and the target device 104 generally communicate via implementation of the signal TC having a compatible communication protocol. In one example, the communication port 120 may be configured to conform to a serial communication protocol. In another example, the communication port 120 may be configured to conform to a Universal Serial Bus (USB) communication protocol. In one more example, the communication port 120 may be configured to conform to IEEE-1394 (Firewire) communication protocol. In yet another example, the communication port 120 may be configured to conform to a parallel communication protocol. In still another example, the communication port 112 is configured to conform to at least one Ethernet protocol. However, the communication port 120 may be configured to conform to any appropriate communication protocol to meet the design criteria of a particular application.

The interface device (i.e., hookup, link, interconnection, etc.) 106 generally presents the signals TC between the test device 102 and the target device 104. The interconnection device 106 may support the alternative communication protocols. A first end of the interface device 106 may be connected to a test device port 112 and a second end of the interface device 106 may be connected to a respective target device port 120. In one example, the interface device 106 may be implemented as a wire cable. In another example, the interface device 106 may be implemented as a fiber optic cable. However, the interface device 106 may comprise any appropriate signal conductor to meet the design criteria of a particular application.

Figure 1B:
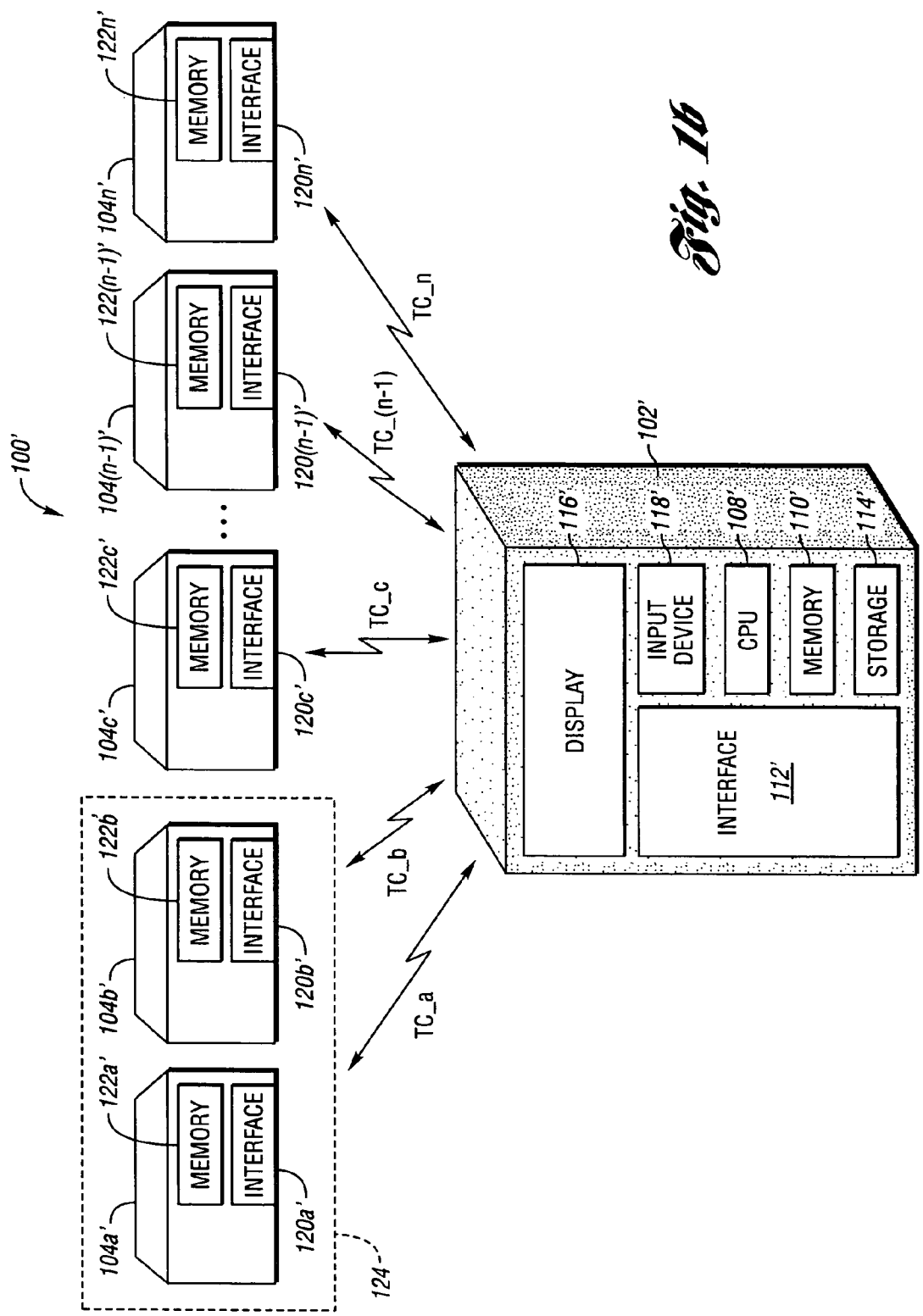

Referring to FIG. 1b, a diagram illustrating a device performance test system 100' is shown. The system 100' may be implemented similarly to the system 100. The system 100' generally comprises a test device 102' and at least one target device 104' (e.g., target devices 104a'–104n').

The system 100' generally provides for wireless (e.g., infra-red (IR), radio frequency (RF), ultrasonic, etc.) bi-directional communication of the signals TC to and from (i.e., between) the test device 102' and at least one target (or tested) device 104'. As such, the system 100' is generally implemented without the interface 106 of system 100.

The test device 102' generally comprises a wireless interface (or port) 112'. The target device 104' generally comprises a wireless interface 120'. The interfaces 112' and 120' are generally implemented having compatible communication protocols. The target devices 104' are generally wirelessly coupled to the test device 102'.

In another example (not shown), a combination of the systems 100 and 100'. As such, the test device 102 may be configured to test the performance of at least one target device 104 via a respective interconnect 106, and at least one target device 104' wirelessly.

Figure 2:
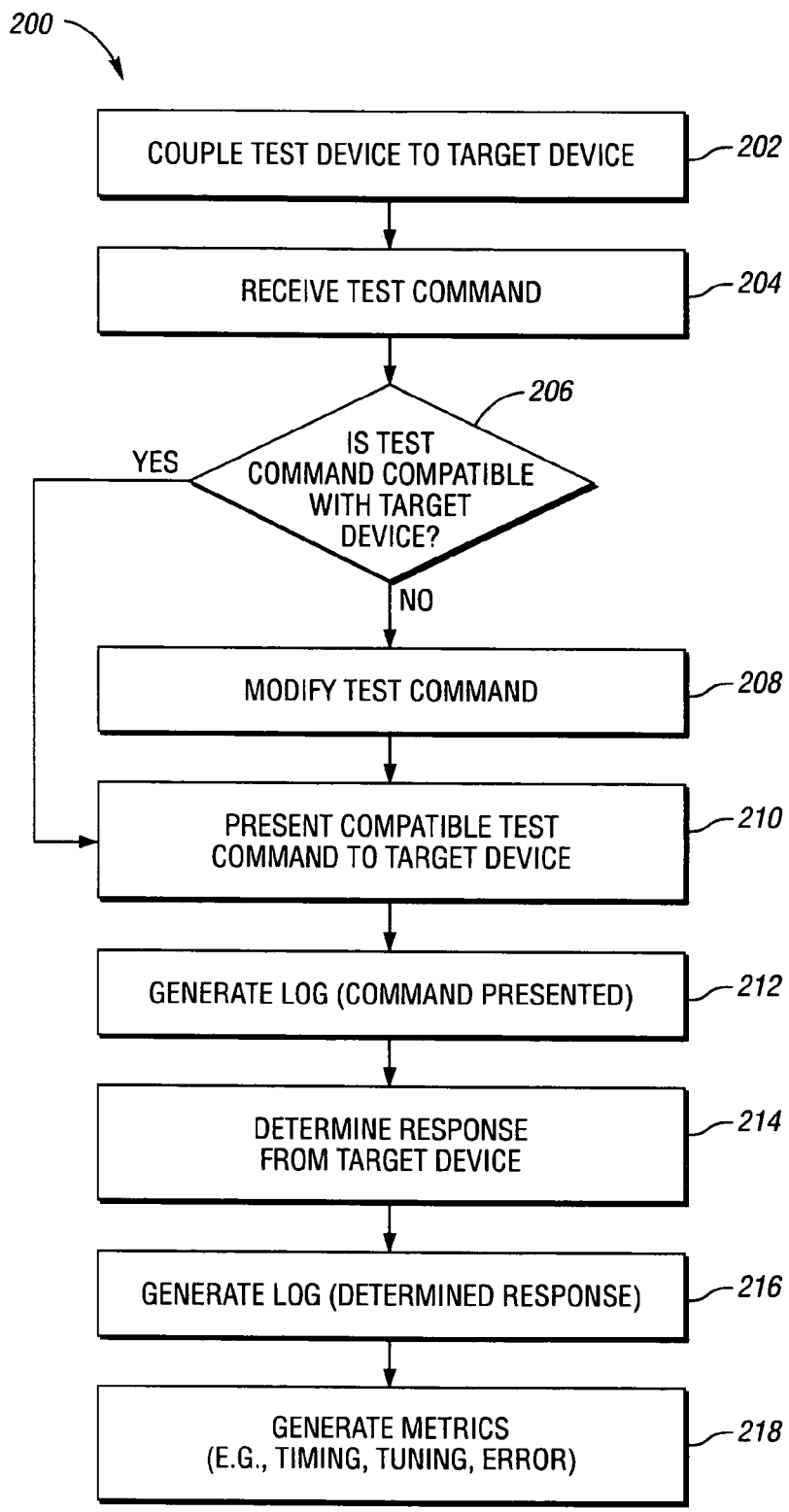
FIG. 2 is a diagram illustrating an operation of the present invention.

Referring to FIG. 2, a diagram illustrating an operation 200 (i.e., method, process, procedure, routine, steps, blocks, algorithm, etc.) of the present invention is shown. The method 200 may be advantageously implemented in connection with the device test systems 100 and 100' of the present invention.

The test device 102 is generally coupled to at least one target device 104 (step or block 202). When the system 100 is implemented, the test device 102 is generally connected to at least one target device 104 via a respective cable 106. In the case of an implementation of the system 100', the coupling between the test device 102' and the at least one target device 104' is generally wirelessly performed.

The test device 102 generally receives test commands (e.g., commands TC_a–TC_n), and stores the test commands TC in memory 110 (step or block 204). In one example, the test commands TC (e.g., STB channel tuning, STB menu commands, power on/off, STB menu navigation, and the like) are retrieved (i.e., received) by the test device 102 from an Extensible Markup Language (XML) file residing on (i.e., held by, stored in, contained in, etc.) the storage device 114. In another example, the test commands TC are received from (i.e., entered via) the user input device 118. However, the test commands TC may be presented to the test device 102 using any appropriate format to meet the design criteria of a particular application.

The test device 102 generally determines when at least one test command TC is incompatible with at least one target device 104 (decision step or block 206). When the test command TC is not compatible with the target device 104 (the NO leg of the decision block 206) the device 102 may modify the incompatible test command TC such that the incompatible test command TC is made compatible with the respective target device 104 (step or block 208).

The compatibility determination (i.e., the decision step or block 206) may be performed by comparing target device manufacturer defined communication commands with the received test command (e.g., a command TC). The manufacturer defined communication commands may be determined by referencing target device make and model information supplied by the user of the test device 102 to a table (not shown) residing in the memory 110.

When the test command TC is incompatible with the destination target device 104, the test device 102 generally modifies (i.e., changes, adjusts, substitutes, etc.) the test command TC such that the test command TC is made compatible with (i.e., adheres to) the manufacturer defined communication command (step or block 208).

When the test command TC is determined to be (or, alternatively, modified to be) compatible with the target device 104, the compatible test command (e.g., TC_a, TC_b, etc.) is presented to the target device 104 by transmitting the test command TC via the interface device 106 (step or block 210) when the system 100 is implemented and wirelessly when the system 100' is implemented. In one example, the test command TC is determined to be compatible when the YES leg of the decision block 206 is selected. In another example, the test command TC is determined to be compatible after the test command TC has been modified in block 208. A log of the transmission of the signal TC (not shown) may be generated, written to the storage device 114, and shown on the display device 116 (step or block 212).

The communication link 106 in the case of the implementation of the method 200 in connection with the system 100 and the wireless communication of the signals TC in the case of the implementation of the system 100' may be bi-direction such that acknowledgments, status information (e.g., channel status, target device status, etc.), and responses from the target device 104 may be determined (i.e., presented by the target device 104 to the test device 102 as a signal TC), and an appropriate return response may be performed (e.g., a command TC) by the test device 102 (step or block 214).

When a response (e.g., a signal TC) from the respective target device 104 has not been received by the test device 102 within a predetermined time, the test device 102 may timeout. In one example, a timeout condition may cause (i.e., trigger, initiate, etc.) the test device 102 to retransmit the respective test command TC (i.e., re-initiate step 210). In another example, a timeout condition may trigger the test device 102 to fall through to the next step of the process 200 (i.e., the process 200 may transition to the step 216).

In yet another example, a timeout condition may trigger the test device 102 to enter a fault condition (i.e., state, mode, etc.) (i.e., cease operation). However, the response to a timeout condition may trigger any appropriate action to meet the design criteria of a particular application. A log of the determined response or timeout may be generated, written to the storage device 114, and shown on the display 116 (step or block 216).

The test device 102 may also generate (i.e., determine, formulate), display (i.e., send to the display device 116), and store (i.e. write to the storage device 114) metrics (i.e., indications of performance for device, system, subsystem, component, and the like. Metrics may include performance to benchmark routines, guidelines, standards, and the like). The metrics may include timing metrics, tuning metrics, error metrics, successful commands metrics, and failed commands metrics (step or block 218).

As is readily apparent from the foregoing description, then, the present invention generally provides an improved apparatus (e.g., the systems 100 and 100') and an improved method (e.g., the method 200) for testing electronic devices. The improved system and method of the present invention may allow a user knowledgeable in a single generic command language (i.e., generic set of user test commands) to issue commands to devices designed by multiple manufacturers. Furthermore, the improved system and method may allow a user to utilize new port types and protocols as they become available (i.e., as they are implemented by a manufacturer) without incurring the expense associated with purchasing a new test device.

While embodiments of the invention have been illustrated and described, it is not intended that these embodiments illustrate and describe all possible forms of the invention.

Rather, the words used in the specification are words of description rather than limitation, and it is understood that various changes may be made without departing from the spirit and scope of the invention.

What is claimed is:

1. A system for testing device performance, the system comprising:
   a test device; and
   at least one target device coupled to the test device, wherein the test device determines when at least one test command is incompatible with the at least one target device and modifies the at least one incompatible test command such that the at least one incompatible test command is compatible with the at least one target device, presents the at least one compatible test command to the at least one target device, and determines a response of the at least one target device to the respective at least one compatible test command.

2. The system of claim 1 wherein the test device logs the test commands sent from the test device to the at least one target device and the respective responses from the at least one target device received by the test device.

3. The system of claim 1 wherein the test device generates at least one of a timing metrics, tuning metrics, error metrics, successful commands metrics, and failed commands metrics.

4. The system of claim 1 wherein the at least one test command is in Extensible Markup Language (XML) format.

5. The system of claim 1 wherein the at least one target device includes a memory having serial-enabled platform code stored therein.

6. The system of claim 1 wherein the at least one test command is presented to the at least one target device using a serial communication protocol.

7. The system of claim 1 wherein the at least one test command is presented to the at least one target device using at least one of IEEE-1394 (Firewire), Universal Serial Bus (USB), Ethernet, and parallel communication protocol.

8. The system of claim 1 wherein a plurality of target devices is defined as a target device group, and the at least one test command is presented to the target device group.

9. The system of claim 8 wherein each target device of the target device group independently executes the at least one test command such that a success or failure response to at least one test command of a first target device does not affect a response of any other target device of the group.

10. The system of claim 1 wherein the test device substantially simultaneously presents a plurality of the at least one test commands to a plurality of target devices.

11. The system of claim 1 wherein the at least one target device is a set top box and the target device is coupled to the at least one target device using an interface cable.

12. A method for testing device performance, the method comprising:
   coupling a test device to at least one target device;
   determining when at least one test command is incompatible with the at least one target device;
   modifying the at least one test command when the at least one test command is incompatible with the at least one target device such that the at least one incompatible test command is compatible with the at least one target device;
   presenting the at least one compatible test command to the at least one target device; and
   determining a response of the at least one target device to the respective at least one compatible test command.

13. The method of claim 12 further comprising the step of generating a log of the test commands sent from the test device to the at least one target device and the respective responses from the at least one target device received by the test device.

14. The method of claim 12 further comprising the step of generating at least one of a timing metrics, tuning metrics, error metrics, successful commands metrics, and failed commands metrics.

15. The method of claim 12 further comprising presenting the at least one test command to the at least one target device using a serial communication protocol.

16. The method of claim 12 further comprising presenting the at least one test command to the at least one target device using at least one of LEEE-1394 (Firewire), Universal Serial Bus (USB), Ethernet, and parallel communication protocol.

17. The method of claim 12 further comprising defining the plurality of target devices as a target device group, and presenting the at least one test command to the target device group.

18. The method of claim 17 wherein each target device of the target device group independently executes the at least one test command such that a success or failure response to at least one test command of a first target device does not affect a response of any other target device of the group.

19. The method of claim 12 wherein the target device is a set top box and the target device is coupled to the at least one target device using an interface cable.

20. A system for testing device performance, the system comprising:
   a test device having a computer; and
   at least one target device coupled to the test device using an interface cable, wherein the test device presents a script having at least one test command predetermined by a manufacturer of the at least one target device to the at least one target device, and determines a response of the at least one target device to the respective at least one test command, and wherein the test device determines when at least one test command is incompatible with the at least one target device and modifies the at least one incompatible test command such that the at least one incompatible test command is compatible with the at least one target device, presents the at least one compatible test command to the at least one target device, and determines a response of the at least one target device to the respective at least one compatible test command.

* * * * *

UNITED STATES PATENT AND TRADEMARK OFFICE
CERTIFICATE OF CORRECTION

PATENT NO. : 7,155,653 B2 Page 1 of 1
APPLICATION NO. : 10/909879
DATED : December 26, 2006
INVENTOR(S) : Edward D. Monnerat It is certified that error appears in the above-identified patent and that said Letters Patent is hereby corrected as shown below:

Column 8, Line 24, Claim 16:

Delete "LEEE-1394" and insert therefor -- IEEE-1394 --.

Signed and Sealed this

Twenty-seventh Day of March, 2007

JON W. DUDAS
*Director of the United States Patent and Trademark Office*